United States Patent
Derycke et al.

(10) Patent No.: US 7,008,886 B2
(45) Date of Patent: Mar. 7, 2006

(54) PROCESS FOR TREATMENT OF THE SURFACE OF A SEMICONDUCTING MATERIAL, PARTICULARLY USING HYDROGEN, AND SURFACE OBTAINED USING THIS PROCESS

(75) Inventors: Vincent Derycke, Montigny-le-Bretonneux (FR); Patrick Soukiassan, St Remy les Cheurevse (FR)

(73) Assignee: Commissariat a l'Energie Atomique, Paris (FR)

(*) Notice: Subject to any disclaimer, the term of this patent is extended or adjusted under 35 U.S.C. 154(b) by 0 days.

(21) Appl. No.: 10/473,279

(22) PCT Filed: Apr. 17, 2002

(86) PCT No.: PCT/FR02/01323

§ 371 (c)(1),
(2), (4) Date: Sep. 29, 2003

(87) PCT Pub. No.: WO02/086202

PCT Pub. Date: Oct. 31, 2002

(65) Prior Publication Data

US 2004/0104406 A1 Jun. 3, 2004

(30) Foreign Application Priority Data

Apr. 19, 2001 (FR) .......................................... 01 05317

(51) Int. Cl.
*H01L 21/00* (2006.01)

(52) U.S. Cl. ........................ 438/931; 438/974; 438/475

(58) Field of Classification Search ................. 438/931, 438/105, 475, 663, 674, 680, 681, 974
See application file for complete search history.

(56) References Cited

U.S. PATENT DOCUMENTS

| 5,363,800 A | * | 11/1994 | Larkin et al. .................. 117/95 |
| 5,420,443 A | * | 5/1995 | Dreifus et al. ................ 257/77 |
| 6,274,234 B1 | * | 8/2001 | Dujardin et al. ............ 428/336 |
| 6,667,102 B1 | * | 12/2003 | Amy et al. ................. 428/446 |

FOREIGN PATENT DOCUMENTS

| FR | 2757183 | 12/1996 |
| FR | 2786794 | 12/1998 |
| FR | 2801723 | 11/1999 |
| JP | 9181355 | 7/1997 |

OTHER PUBLICATIONS

F. Semond et al., "Atomic Structure of the β–SiC(100)–(3× 2)Surface", The American Physical Society, vol. 77, No. 10, Sep. 2, 1996, pp. 2013–2016.

T.C. Shen et al., "Atomic–Scale Desorption Through Electronic and Vibrational Excitation Mechanism", Science, vol. 268, Jun. 16, 1995, pp. 1590–1592.

F. Maier et al., "Origin of Surface Conductively in Diamond", The American Physical Society, vol. 85, No. 16, Oct. 16, 2000, pp. 3472–3475.

(Continued)

*Primary Examiner*—David Nhu
(74) *Attorney, Agent, or Firm*—Thelen Reid & Priest LLP

(57) ABSTRACT

A process treats a surface of a semiconductor material in order to put the surface into a predetermined electrical state. The semiconductor material is preferably monocrystalline. The process includes (a) preparing the surface of the semiconductor material such that the surface has a controlled organization at an atomic scale such that the surface is capable of combining with a chosen material, and (b) combining the surface thus prepared with a material chosen from among hydrogen, molecules containing hydrogen, metals, organic molecules and inorganic molecules, wherein the preparing and the combining the surface with the material cooperate to obtain the predetermined electrical state of the surface.

12 Claims, 1 Drawing Sheet

OTHER PUBLICATIONS

Taro Hitosugi et al., "*Scanning Tunneling Microscopy/Spectroscopy Of Dangling–Bong Wires Fabricated On The Si(100)–2×1–H Surface*", Elsevier Science, 1998, pp. 340–345.

P. Doumergue et al., "*Conductance Of A Finite Missing Hydrogen Atomic Line On Si(100)–(2×1)–H*", The American Physical Society, vol. 59, No. 24, Jun. 15, 1999, pp. 15910–15916.

K. Oura et al., "*Hydrogen Interaction With Clean And Modified Silicon Surfaces*", Elsevier Science, pp. 48–51.

P. Kratzer et al., "*Site–Specific $H_2$ Adsorption on Vicinal Si(001)Surfaces*", The American Physical Society, Dec. 21, 1998, pp. 5596–5599.

P. Soukiassian et al., "*Direct Observation of a β–SiC(100)–c)(4×2)Surface Reconstruction*", The American Physical Society, vol. 78, No. 5, Feb. 3, 1997, pp. 907–910.

International Search Report, PCT/FR 02/01323, International filing date Apr. 17, 2002, date Search Report mailed– Sep. 2, 2002.

\* cited by examiner

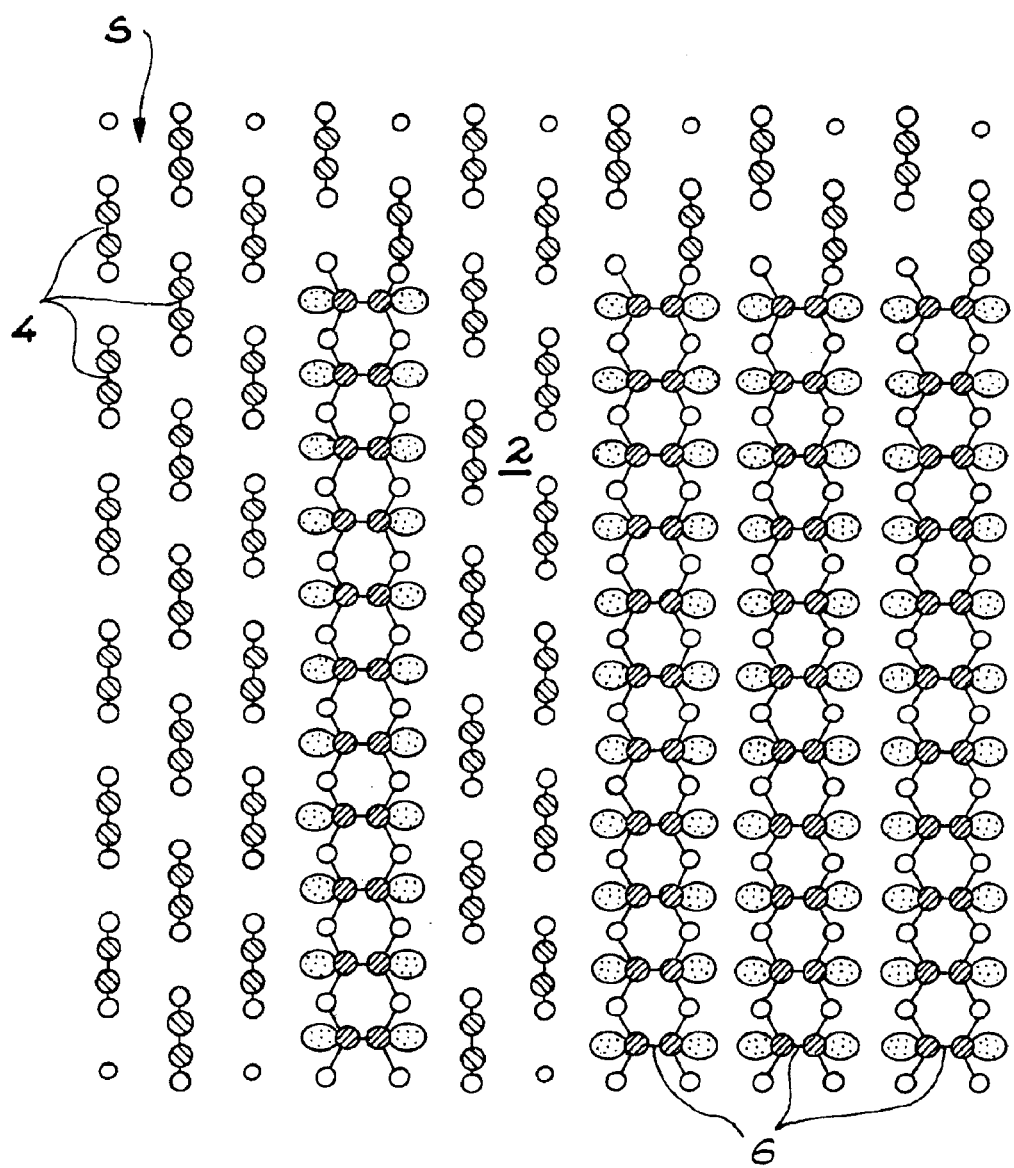

PROCESS FOR TREATMENT OF THE SURFACE OF A SEMICONDUCTING MATERIAL, PARTICULARLY USING HYDROGEN, AND SURFACE OBTAINED USING THIS PROCESS

CROSS-REFERENCE TO RELATED APPLICATION

This application claims priority based on International Patent Application No. PCT/FR02/01323, entitled "Method For Treating The Surface of a Semiconductor Material" by Vincent DERYCKE and Patrick SOUKIASSIAN, which claims priority of French application no. 01/05317, filed on Apr. 19, 2001, and which was not published in English.

TECHNICAL DOMAIN

This invention relates to a process for treatment of the surface of a semiconducting material, particularly using hydrogen.

Depending on the treatment, the invention makes it particularly possible to metallise or passivate this semiconducting material surface.

The invention is particularly applicable to microelectronics.

STATE OF PRIOR ART

For further information about how the surface of a semiconducting material can be metallised using hydrogen, refer to the following documents:

[1] F. Maier et al., Phys. Rev. Lett. 85, 3472 (2000)

[2] T.-C. Shen et al., Science, 268, 1590 (1995)

[3] Hitosugi et al., Applied Surface Science, 130–132 (1998) 340–345

[4] P. Doumergue et al., Physical Review B, 59, 22 (1995).

Document [1] describes the study of the mechanism by which surface conductivity can be conferred on a diamond after hydrogenation. It is shown that hydrogen is necessary but is not sufficient to set up this conductivity and that the latter is made possible by the presence of moisture in air. This change to the diamond is not restricted to the surface but occurs in depth, which makes it similar to doping.

There are disadvantages with the technique described in document [1].

The resulting doping cannot achieve one of the advantages of using hydrogen, which is to obtain the finest possible metallised surface and a steep interface enabling the best possible contact, which is important in electronics.

Furthermore, the conductivity obtained by the mechanism described in this document [1] is only possible with hydrogenated diamond and not with other semiconductors.

Document [2] discloses that if groups of hydrogen atoms are selectively removed from an hydrogenated Si (100) surface using an STM (scanning tunnelling microscope), this surface can be metallised locally.

The technique described in document [2] has disadvantages: metallisation of the surface requires subsequent adsorption of a metal and remains localised.

According to documents [3] and [4], selective tearing off of one of the two hydrogen atoms terminating silicon dimers is a means of obtaining a metallised line.

The technique described in these documents [3] and [4] has disadvantages.

It requires the use of an STM for tearing off hydrogen atoms one after the other, and only one metallised line is obtained in each operation.

Furthermore, this technique is long and expensive to use, which makes it difficult to apply industrially.

Refer to the following documents for further information about passivation of the surface of a semiconducting material, using hydrogen:

[5] M. Oura et al., Surf. Sci. Rep. 35, 1 (1999)

[6] P. Kratzer et al., Phys. Rev. Lett. 81, 25 (1998).

Document [5] discloses techniques that consist of either passivating a silicon surface by exposing it to atomic hydrogen, or chemically etching the silicon using hydrofluoric acid solutions.

The techniques described in document [5] have the following disadvantages:

molecular hydrogen has to be dissolved to obtain atomic hydrogen, this reaction cannot be made at ambient temperature, and chemical etching deteriorates the surface of the material at the atomic scale (elimination of Si).

Document [6] discloses passivation of an Si (100) 2×1 surface by dissociative adsorption of molecular hydrogen.

The technique described in document [6] has disadvantages.

The mechanism involved in this dissociation requires the presence of surface imperfections. Therefore, passivation is very localised since the parts of the material in which there are none of these imperfections do not react at ambient temperature.

PRESENTATION OF THE INVENTION

The purpose of this invention is to overcome the previous disadvantages by proposing a simpler process than the known techniques mentioned above, in order to put the surface of a semiconducting material into a given electrical state.

In particular, the invention relates to:

a process for metallisation of the surface of a semiconducting material, that does not have the disadvantages of techniques disclosed by documents [1] to [4], and a process for passivation of the surface of a semiconducting material that does not have the disadvantages of the techniques disclosed in documents [5] and [6].

More precisely, this invention relates to a process for treatment of the surface of a semiconducting material in order to put this surface into a predetermined electrical state, the semiconducting material preferably being monocrystalline, this process being characterised in that:

the surface of the semiconducting material can be prepared so that this surface has a controlled organization at the atomic scale, and the surface thus prepared is combined with a material chosen from among hydrogen, molecules containing hydrogen, metals, organic molecules and inorganic molecules, the preparation and hydrogenation of the surface cooperating to obtain the predetermined electrical state of the surface.

According to a first particular embodiment of the process according to the invention in which the material is hydrogen, the predetermined electrical state is a conducting state and the process enables metallisation of the surface of the semiconducting material, this surface is prepared such that this surface has dangling bonds capable of adsorbing hydrogen atoms, and the surface thus prepared is hydrogenated so that this surface can be metallised.

In the case of this first particular embodiment:

the surface thus prepared can be hydrogenated by directly exposing this surface to hydrogen in the atomic state, until this surface is saturated by this atomic hydrogen, or an ex situ chemical hydrogenation technique can be used, in other words in a device different from the device in which the surface was prepared, the semiconducting material is for example silicon carbide, preferably, the silicon carbide structure is cubic and the silicon carbide surface is prepared so as to give a controlled 3×2 symmetry organization at the atomic scale, and this surface is then exposed to atomic hydrogen until it is saturated, preferably, the silicon carbide is kept at a temperature within the interval between ambient temperature and 900° C., and particularly at 300° C., during hydrogenation of the silicon carbide surface, and the hydrogen may be pure hydrogen, in other words the $^1$H isotope, or deuterium, in other words the $^2$H isotope, or a mix of these two isotopes, and particularly natural hydrogen.

According to a second particular embodiment of the process according to the invention in which the material is hydrogen, the predetermined electrical state is an insulating state, the semiconducting material is cubic silicon carbide and the process makes it possible to passivate the surface of cubic silicon carbide, this surface is prepared so that this surface has a controlled c(4×2) symmetry organization at the atomic scale, and the surface thus prepared is treated to obtain a 2×1 surface which is ordered at the atomic scale and saturated with hydrogen.

In this case, according to one particular embodiment of the invention, the 2×1 surface which is ordered at the atomic scale and saturated with hydrogen is obtained by exposing the surface with a controlled c(4×2) symmetry organization at the atomic scale, to molecular hydrogen until the surface is saturated, while keeping the silicon carbide at ambient temperature (equal to approximately 20° C.).

For example, the molecular hydrogen pressure is approximately equal to $10^{-8}$ hPa.

According to a third particular embodiment of the process according to the invention in which the predetermined electrical state is a semiconducting state and the semiconducting material is a monocrystalline substrate of silicon carbide terminated by an atomic plane of sp configuration carbon forming the material surface, this plane is transformed into an atomic plane of carbon with an sp$^3$ configuration of the diamond type, while the surface is exposed to the material in order to facilitate this transformation.

This invention also relates to the surface of the semiconducting material obtained by the process according to the invention.

BRIEF DESCRIPTION OF THE DRAWING

This invention will be better understood after reading the description of the example embodiments given below, for information only and in no way limitatively, with reference to the single attached figure that diagrammatically illustrates a process conform with the invention.

DETAILED DESCRIPTION OF PARTICULAR EMBODIMENTS

We will now describe an example of the process according to the invention by which semiconducting surfaces (or more precisely surfaces of semiconducting materials) that have the specific feature of having dangling bonds that are capable of collecting hydrogen atoms, can be "metallised", in other words can be made electrically conducting.

In this example, the surface of a monocrystalline silicon carbide (SiC) substrate with a cubic structure is treated.

The example considered provides a means of overcoming the disadvantages of prior art by metallising the entire Sic surface by direct exposure to atomic hydrogen (natural) until saturation, without it being necessary to use a complicated device.

Note that this behaviour of hydrogen (metallisation action) is the opposite of its normal function which is to passivate semiconducting surfaces.

Metallisation takes place only on the surface while the subjacent layers of the material thus treated remain semiconducting, which is a particularly useful property in microelectronics in which an attempt is made to find a sudden interface between conducting and semiconducting elements of a circuit and the thinnest possible contact between the different elements of the circuit.

In the example considered, the surface of cubic SiC is prepared using hydrogen to present a controlled 3×2 symmetry organization on the atomic scale, so that the surface can be metallised. This surface is then exposed to atomic hydrogen until saturation. The SiC is kept at a temperature of 300° C. during exposure to hydrogen.

More precisely, the cubic SiC surface is metallised using hydrogen by following the procedure described hereinafter. Concerning this procedure one may also refer to WO 98/27578 ("Fils atomiques de grande longueur et de grande stabilité, procédé de fabrication de ces fils, application en nanoélecronique") and to Semond et al., Phys. Rev. Lett. 77, 2013 (1996).

The cubic SiC is placed in a treatment chamber, in which the pressure is kept at less than $5 \times 10^{-10}$ hPa, and is heated by passing an electric current directly in this SiC substrate. The latter is heated to 650° C. for several hours and its temperature is then increased to 1100° C. several times for one minute each time.

A silicon source heated to 1300° C. is used to deposit several single layers of silicon on the (100) surface of cubic SiC.

Thermal annealing operations are carried out to evaporate some of the deposited silicon in a controlled manner, until the surface is organised with 3×2 symmetry at the atomic scale (reconstruction). This surface symmetry may be checked by diffraction of electrons.

This surface is then exposed to atomic hydrogen. This atomic hydrogen is produced using ultra pure molecular hydrogen decomposed using an incandescent tungsten filament at a distance of 2 cm from the SiC. During this exposure, the surface is kept at a temperature equal to 300° C.

The surface must be exposed until saturation. This saturation can be checked using an STM (Scanning tunnelling microscope) or using the valence band photo-emission technique.

The STM shows that the saturated surface is well ordered and has 3×2 symmetry.

Valence band photo-emission reveals the metallic nature of the saturated surface; the spectra of photo-emission from the 3×2 surface saturated with atomic hydrogen have a non-zero states density at the Fermi level (Fermi step).

This process according to the invention that is described in the above example, is not limited to SiC. It is applicable to other elementary semiconductors and composite semiconductors with the special feature of having dangling bonds capable of collecting hydrogen atoms.

Furthermore, instead of natural hydrogen in the atomic state, the $^1$H isotope can be used alone (in the atomic state) or the $^2$H isotope can be used alone (in the atomic state), or any mix of the $^1$H and $^2$H isotopes can be used (in the atomic state).

Other hydrogenation techniques are also possible.

In particular, an ex-situ chemical technique (for example a wet hydrogenation technique—see document [2]) can be used in order to metallize the SiC surface by hydrogen.

In fact, any method of obtaining a 3×2 surface which is ordered at the atomic scale and saturated with hydrogen will result in metallisation of the surface.

Note that the conducting surfaces thus obtained have technical improvements over prior art (thin contact, steep interface).

We will now describe a second example of the process according to the invention, making it possible to passivate a βSiC (100)c(4×2) semiconducting surface by exposing this surface to molecular hydrogen at ambient temperature.

The invention provides a means of overcoming the disadvantages of processes according to prior art and simplifying these processes, by directly applying very low pressures of molecular hydrogen ($10^{-8}$ hPa) at ambient temperature, to the β-SiC(100)c(4×2) surface (without the need for a dissociation step).

The resulting passivation is accompanied by a surface structure transition, namely the (c(4×2)→2×1) transition.

The SiC obtained then has a passivated surface without imperfections, each dimer formed being at the same height.

More precisely, the cubic SiC surface is passivated using hydrogen, by preparing this surface such that it has a controlled c(4×2) symmetry organization at the atomic scale. This surface is then exposed to molecular hydrogen until saturation. The SiC is kept at ambient temperature during exposure to molecular hydrogen.

In the example considered, the surface of an SiC cubic substrate can be passivated using hydrogen, proceeding as described below (in this respect, refer also to P. Soukiassian et al., Phys. Rev. Lett. 78, 907 (1977)).

The cubic SiC substrate is placed in a treatment chamber, in which the pressure is kept below $5\times10^{-10}$ hPa, and is heated by passing an electrical current directly in the SiC substrate. The SiC substrate is heated for several hours at 650° C. and is then heated to 1100° C. for one minute several times.

Several silicon monolayers are deposited on the surface (100) of the cubic SiC, using a silicon source heated to 1300° C.

Some of the deposited silicon is evaporated in a controlled manner, using thermal annealings at 1000° C., until the surface has an organization with 3×2 symmetry at the atomic scale (reconstruction). This surface symmetry can be checked by diffraction of electrons.

The surface with 3×2 symmetry is transformed by thermal annealings at 1100° C., until it has an organization with c(4×2) symmetry at the atomic scale (reconstruction).

This surface is then exposed to ultra pure molecular hydrogen at low pressure ($10^{-8}$ hPa).

The surface is kept at ambient temperature during this exposure.

The SiC surface is exposed until it is saturated (saturation greater than 50 L).

This saturation may be checked by STM or by a valence band photo-emission technique.

The STM reveals a 2×1 ordered surface.

Valence band photo-emission reveals that the electronic surface state caused by dangling bonds of surface silicon has disappeared.

Other techniques, in particular ex situ chemical techniques, would make it possible to passivate the SiC surface using hydrogen.

In fact, any method of obtaining a 2×1 surface which is ordered at the atomic scale and saturated with hydrogen must result in surface passivation.

We will now describe a third example of the process according to the invention. Concerning this example we refer to the following document:

[7] International application No. PCT/FR99/02979, International publication No. WO 00/32853, entitled "Couche monoatomique et monocristalline de grande taille, en carbone de type diamant, et procédé de fabrication de cette couche", invention by V. Derycke, G. Dujardin, A. Mayne and P. Soukiassian.

According to the process described in this document [7], a monocrystalline substrate 2 (figure) is formed made of SiC terminated by an atomic plane S of carbon according to a c(2×2) reconstruction, this plane being a carbon—carbon dimer plane 4 with sp configuration, and this substrate is annealed at least once, this annealing being capable of transforming the carbon—carbon dimer plane 4 with sp configuration into a carbon—carbon dimer plane 6 with $sp^3$ configuration, thus forming a monoatomic monocrystalline layer of diamond type carbon.

In the considered example of the invention, the surface S of the substrate 2 (atomic plane of carbon) is exposed to molecular or atomic hydrogen while this (or these) annealing(s) is (are) carried out.

The interaction of hydrogen with this sp type carbon terminated surface facilitates the diamond type $sp^3$ transition, since the hydrogen atoms brittle and break the sp type C≡C triple bonds which facilitates the formation of carbon dimers with simple bonds C—C of $sp^3$ type of diamond type.

In order to facilitate the diamond type $sp^3$ transition, molecules containing hydrogen, metals (for example alkaline metals or transition metals) or other organic or inorganic molecules making it possible to obtain this transition can be used instead of hydrogen.

What is claimed is:

1. A process for treatment of a surface of a semiconductor material in order to put the surface into a predetermined electrical state, the semiconductor material preferably being monocrystalline, said process comprising:

preparing the surface of the semiconductor material such that the surface has a controlled organization at an atomic scale such that the surface is capable of combining with a chosen material, and combining the surface thus prepared with a material chosen from among hydrogen, molecules containing hydrogen, metals, organic molecules and inorganic molecules, wherein said preparing and said combining the surface with the material cooperate to obtain the predetermined electrical state of the surface.

2. The process according to claim 1, wherein the material is hydrogen, the predetermined electrical state is a conducting state, and said process enables metallisation of the surface of the semiconductor material, and wherein the surface is prepared such that the surface has dangling bonds capable of adsorbing hydrogen atoms, and the surface thus prepared is hydrogenated so that the surface is capable of being metallised.

3. The process according to claim 2, in which the surface thus prepared is hydrogenated by directly exposing the surface to hydrogen in an atomic state, until the surface is saturated.

4. The process according to claim 2, in which the surface thus prepared is hydrogenated by an ex situ chemical hydrogenation technique.

5. The process according to claim 2, in which the semiconductor material is silicon carbide.

6. The process according to claim 5, in which a structure of the silicon carbide is cubic and a surface of the silicon carbide is prepared so as to give a controlled 3×2 symmetry organization at an atomic scale, and the surface is then exposed to atomic hydrogen until it is saturated.

7. The process according to claim 5, in which the silicon carbide is kept at a temperature within the interval between ambient temperature and 900° C., and particularly at 300° C., during hydrogenation of the surface of the silicon carbide.

8. The process according to claim 2, in which the hydrogen is either one of the $^1H$ isotope, the $^2H$ isotope, and a mix of these two isotopes.

9. The process according to claim 1, wherein the material is hydrogen, the predetermined electrical state is an insulating state and the semiconductor material is cubic silicon carbide, and said process making it possible to passivate a surface of the cubic silicon carbide, and wherein the surface is prepared so that the surface has a controlled c(4×2) symmetry organization at an atomic scale, and the surface thus prepared is treated to obtain a 2×1 surface which is ordered at the atomic scale and saturated with hydrogen.

10. The process according to claim 9, in which, the 2×1 surface which is ordered at the atomic scale and saturated with hydrogen is obtained by exposing the surface with a controlled c(4×2) symmetry organization at the atomic scale, to molecular hydrogen until the surface is saturated, while keeping the silicon carbide at an ambient temperature.

11. The process according to claim 1, the predetermined electrical state being a semiconducting state and the semiconductor material being a monocrystalline substrate of silicon carbide terminated by an atomic plane of sp configuration carbon forming a surface of the silicon carbide, in which the atomic plane is transformed into an atomic plane of carbon with an $sp^3$ configuration of a diamond type, while the surface is exposed to the chosen material in order to facilitate this transformation.

12. A surface (S) of semiconductor material obtained by the process according to claim 1.

* * * * *